US006940345B2

(12) United States Patent
Nair et al.

(10) Patent No.: US 6,940,345 B2
(45) Date of Patent: Sep. 6, 2005

(54) SUPPLYING A RAMP VOLTAGE TO AN AMPLIFIER

(75) Inventors: Vijayakumaran Nair, Austin, TX (US); Kevin McCarville, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 10/748,200

(22) Filed: Dec. 31, 2003

(65) Prior Publication Data

US 2005/0140432 A1 Jun. 30, 2005

(51) Int. Cl.[7] .................................... H03F 1/14
(52) U.S. Cl. ............................ 330/51; 330/258
(58) Field of Search ........................ 330/51, 258

(56) References Cited

U.S. PATENT DOCUMENTS 4,733,171 A * 3/1988 Milkovic .................... 342/142
4,899,152 A * 2/1990 Barrow et al. .............. 341/154
6,348,781 B1 * 2/2002 Midya et al. ............... 323/224
6,509,790 B1 * 1/2003 Yang .......................... 327/554

OTHER PUBLICATIONS

Low Voltage, Stereo DAC with Headphone Amp, Jul. 2002, pp.1-36, CS43L43,CIRRUS LOGIC, Austin, Texas.
PCM codec IC for digital cellular telephones, pp. 599-609, BU8733KV, ROHM, Communication ICs.
PCM codec IC digital cellular telephones, pp. 610-620, BU8731KV, ROHM.

* cited by examiner

*Primary Examiner*—Patricia Nguyen
(74) *Attorney, Agent, or Firm*—Venable LLP; Jeffrey W. Gluck

(57) ABSTRACT

A common mode ramp voltage generator may be used in generating a ramp voltage for the amplifier and thereby eliminating or reducing pop noise.

23 Claims, 9 Drawing Sheets

SUPPLYING A RAMP VOLTAGE TO AN AMPLIFIER

BACKGROUND

In conventional amplifiers, power-up or power-down operations may cause abrupt transient components in amplifier outputs. Such abrupt transient surge components may cause unpleasant audible noise when amplifier outputs are used to drive speakers.

BRIEF DESCRIPTION OF THE DRAWINGS

The invention may be understood by referring to the following description and accompanying drawings that are used to illustrate the embodiments of the invention, wherein like reference numbers generally indicate identical, functionally similar, and/or structurally similar elements. In the drawings.

DETAILED DESCRIPTION OF THE INVENTION

In the following description, numerous specific details are set forth. However, it is understood that embodiments of the invention may be practiced without these specific details. In other circumstances, well known circuits, structures and techniques have not been shown in detail in order not to obscure an understanding of this description.

References to an "exemplary embodiment" indicate that the embodiment(s) of the invention so described may include a particular feature, structure, or characteristic, but not every embodiment necessarily includes the particular feature, structure, or characteristic. Further, repeated use of the phrase "an exemplary embodiment" does not necessarily refer to the same embodiment, although it may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or lesser contact. However, "coupled" may also mean that two or more elements are not in direct contact with each other, but they still co-operate or interact with each other.

Figure 1:
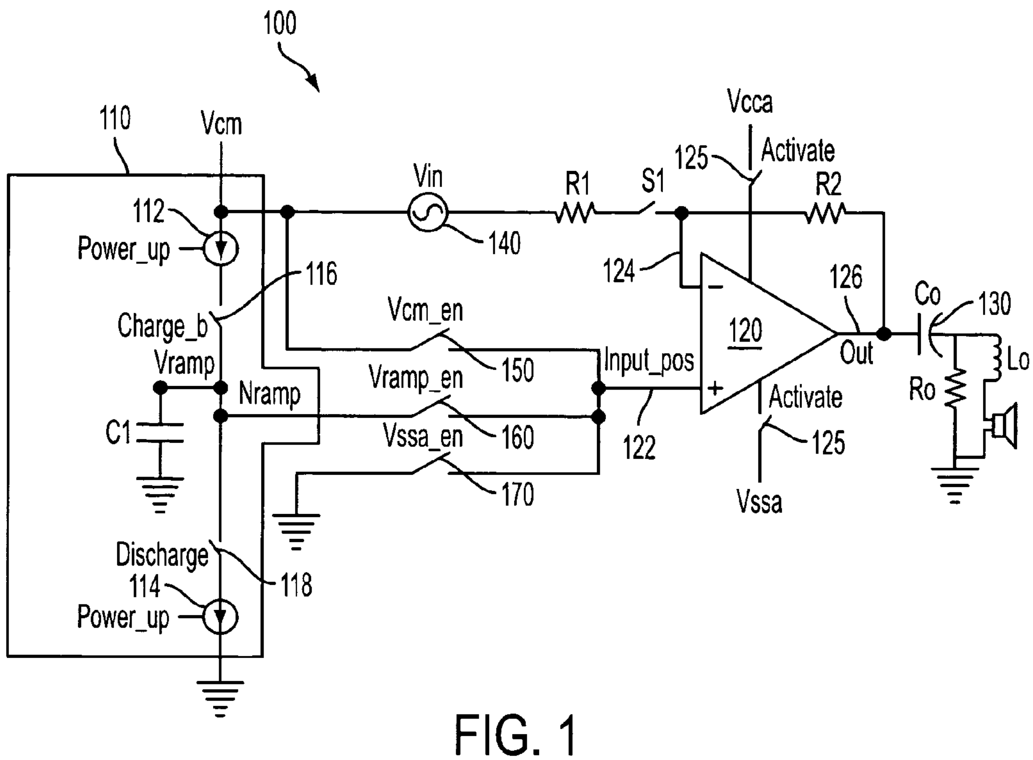
FIG. 1 shows a device according to an exemplary embodiment of the invention.
Figure 2A:
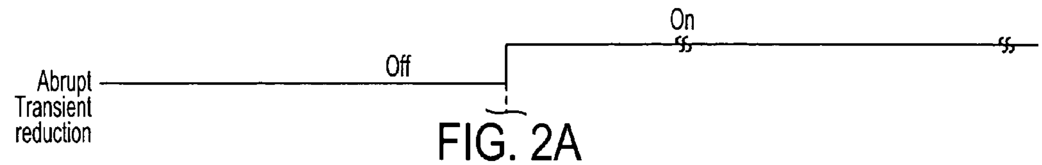
FIGS. 2A–I show a timing diagram illustrating operations of a device according to an exemplary embodiment of the invention.
Figure 2B:
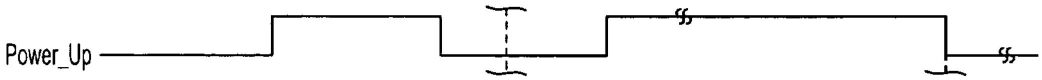
Figure 2C:
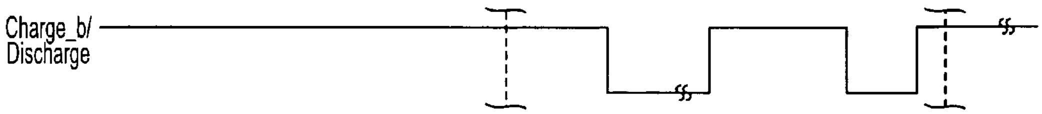
Figure 2D:
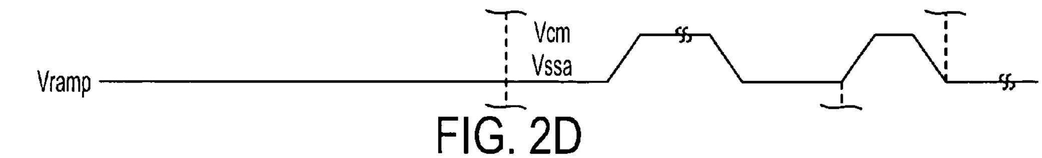
Figure 2E:
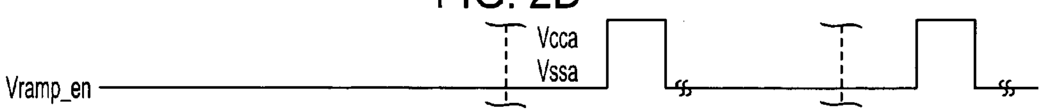
Figure 2F:
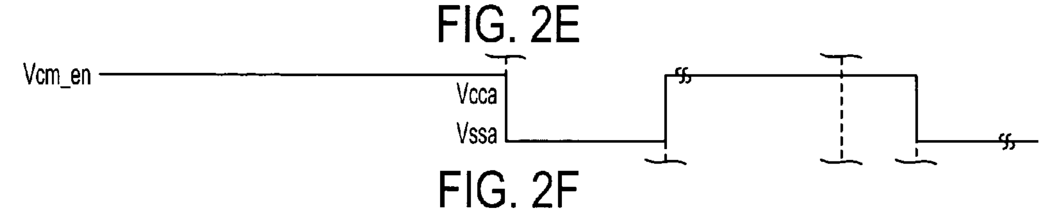
Figure 2G:
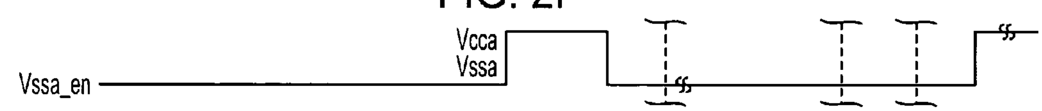
Figure 2H:
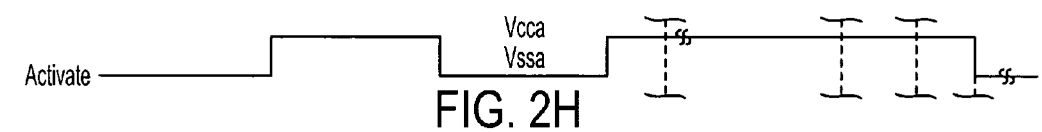
Figure 2I:
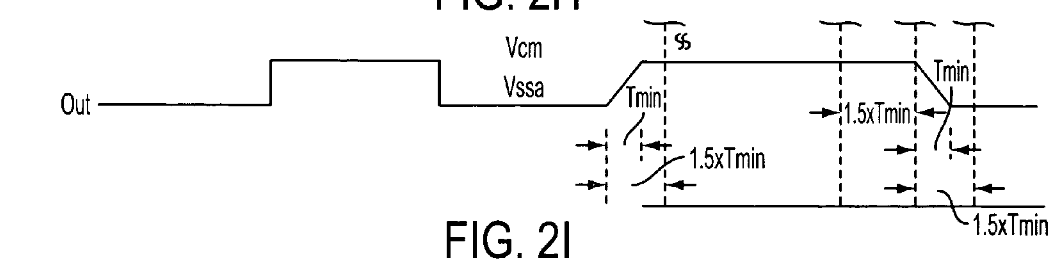
Figure 3A:
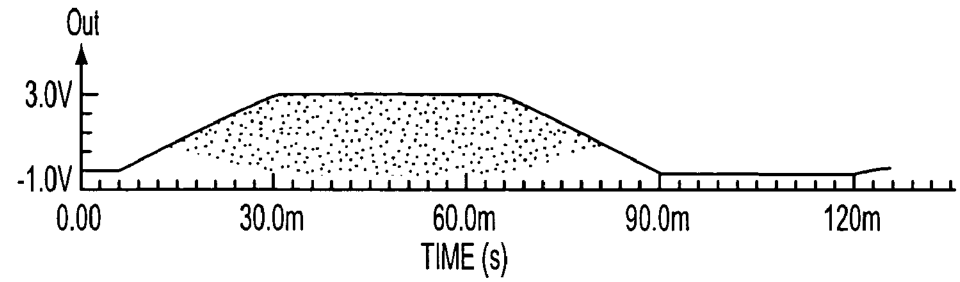
FIGS. 3A–H show a smooth transient operation of a device according to an exemplary embodiment of the invention.
Figure 3B:
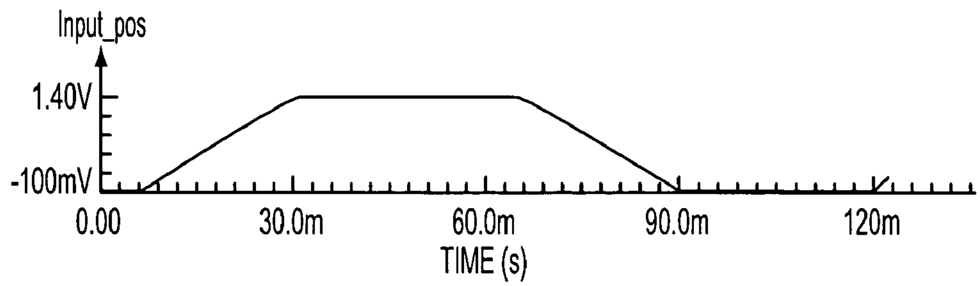
Figure 3C:
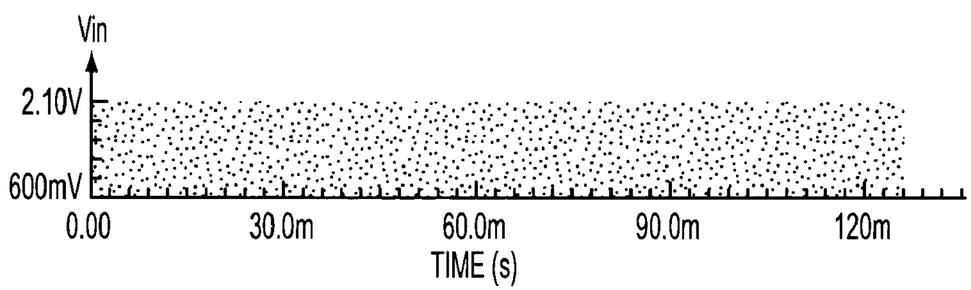
Figure 3D:
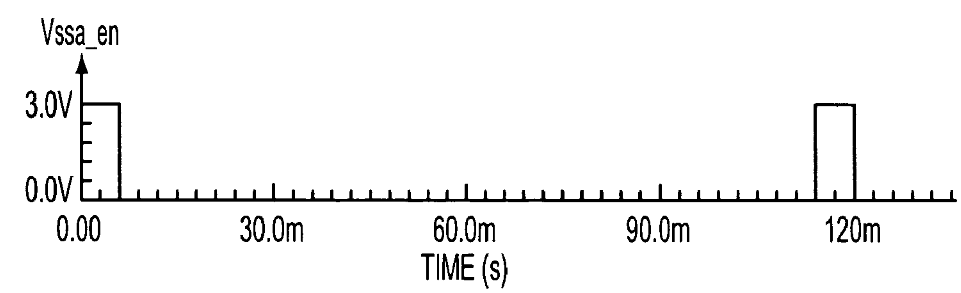
Figure 3E:
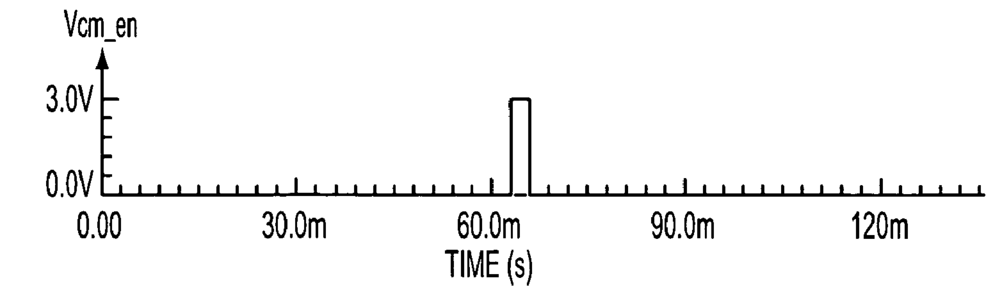
Figure 3F:
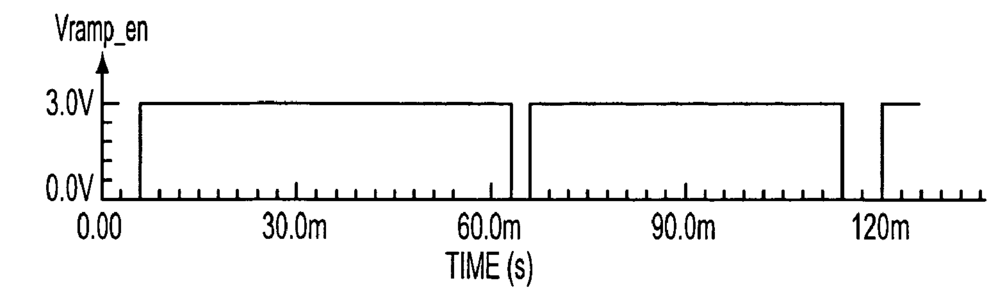
Figure 3G:
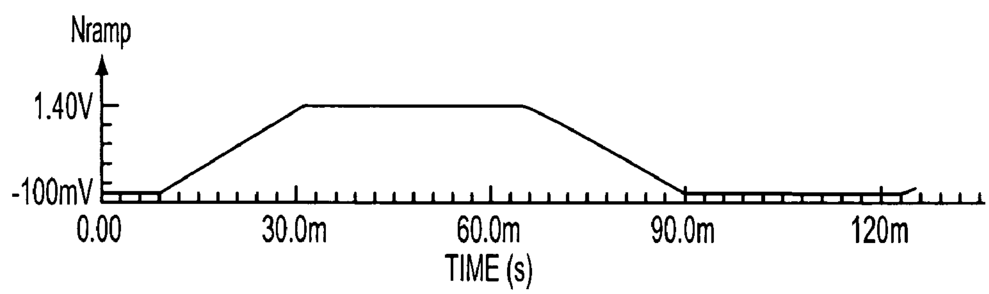
Figure 3H:
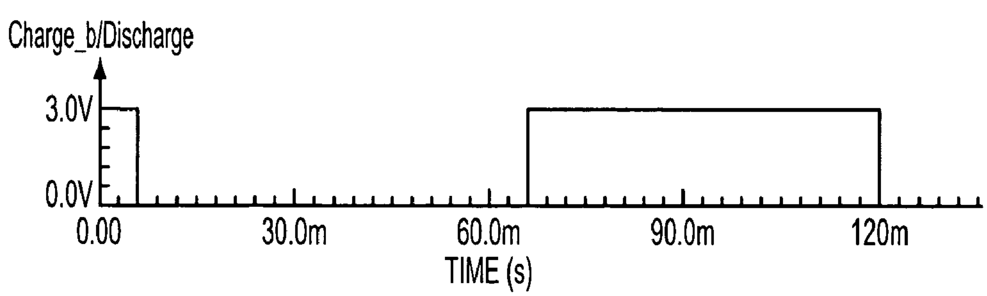

In FIG. 1, a device 100 according to an exemplary embodiment of the invention may include a reference voltage generator 110, an amplifier 120 and an output device 130. The reference voltage generator 110 may generate a ramp voltage Vramp at a node labeled "Nramp" node. The ramp voltage Vramp may be used by the amplifier 120 to generate an amplifier output ("Out") at an amplifier output node 126. By using the ramp voltage Vramp, which may be ramped up or down at a controlled rate of change, the amplifier output at the amplifier output node 126 may have little or no abrupt transient component. The reference voltage generator 110 may have a first supply input node coupled to a common mode reference voltage Vcm of the amplifier 120. The reference generator 110 may have a second supply input node coupled to ground. Alternatively, the second supply input node may be coupled to any other supply voltage other than ground. The common mode reference voltage Vcm may be any common mode voltage of the amplifier including, but not limited to, an analog common mode reference voltage. The reference voltage generator 110 may generate a ramp voltage Vramp by using a current source 112 and a current sink 114 coupled to the Nramp node as depicted or by using other methods including, for example, using a potentiometer to generate a gradually ramping up or ramping down voltage.

The current source 112 and the current sink 114 may receive a Power_up signal to turn on or off the current source and the current sink. The current source 112 may be coupled to the Nramp node via a current source switch 116, and the current sink 114 may be coupled to the Nramp node via a current sink switch 118. The current source switch 116 may be closed or opened by a Charge_b signal, and the current sink switch 118 may be closed or opened by a Discharge signal. The Charge_b signal and the Discharge signal may be a common signal or different signals.

A ramp capacitor C1 may be coupled to the Nramp node. The ramp capacitor C1 may be an on-chip capacitor or an off-chip capacitor and may be formed of one or plural capacitors. The ramp capacitor C1 may have a constant capacitance value or a varying capacitance value. A varying capacitance value of the capacitor C1 may be obtained by any method of varying a capacitance of a capacitor including, but not limited to, when the C1 is an off-chip capacitor, setting the capacitance of the capacitor C1 at a selected value by choosing the off-chip capacitor with an appropriate capacitance value and, when the capacitor C1 is formed of plural capacitors coupled via switches, varying the capacitance of the capacitor C1 by opening and closing switches between the capacitors to achieve a desired combinative capacitance value. The capacitance of the capacitor C1 may be varied before or during an operation of the reference voltage generator 110, and thus, a rate of a change in the ramp voltage Vramp while Vramp is being ramped up or down may be varied before or during the operation.

The current outputs of the current source 112 and the current sink 114 may have a common magnitude or different magnitudes. Each of the current source 112 and the current sink 114 may have a constant current output. Thus, a rate of a change in the ramp voltage Vramp while Vramp is being ramped up or down may be a constant value. Alternatively, current outputs of the current source 112 and the current sink 114 may be varied before or during an operation of the reference voltage generator 110. The current source 112 and the current sink 114 may be variable current sources, and by setting their currents at appropriate values, a rate of a change in the ramp voltage Vramp while Vramp is being ramped up or down may be varied before or during an operation of the reference voltage generator 110.

When the Power_up signal is applied to the current source 112 and the current sink 114, one of the current switches 116 and 118 may be closed, and a voltage at the Nramp node may be ramped up or down at a constant or varying voltage change rate. For example, when a voltage at the Nramp node is at substantially ground, the current source 112 may be turned-on, and the current source switch 116 may be closed. If, for example, the current source 112 is a constant current source, the current source 112 may charge the capacitor C1 to generate a ramp voltage Vramp according to the following equation: Vramp=i×t/C1, where i is the output current of the constant current source 112, t is the charging time and C1 is the capacitance of the capacitor C1. Thus, a voltage change rate of the ramp voltage Vramp may equal i/C1, and the ramp voltage Vramp may change linearly during a ramp up or a ramp down operation of the reference voltage generator 110. Alternatively, an output current from the current source 112 or the current sink 114 may vary, and a voltage change rate of the ramp voltage Vramp may vary before or during an operation of the reference voltage generator 110.

The reference voltage generator 110 may use the common mode reference voltage Vcm of the amplifier 120 as a supply voltage. The common mode reference voltage Vcm of the amplifier 120 may be any common mode reference voltage including, but not limited to, about 1.35 volts, for example. If the current source 112 and the current sink 114 had a constant output current of about 1 μA, for example, a minimum period of time required for the ramp voltage Vramp to traverse from one of Vcm (e.g., 1.35 volts) and ground to the other may be about C1×1.35 seconds, for example, where C1 is in μF. However, depending on the temperature and other process characteristics of the reference voltage generator 110, the ramp voltage Vramp may not change linearly and may ramp up to Vcm asymptotically. For example, as the ramp voltage Vramp ramps up to Vcm, transistors making up the current source 112 may come out of saturation. Thus, the minimum period of time required for the ramp voltage Vramp to traverse from one of Vcm and ground to the other may be longer than the calculated value.

The ramp voltage Vramp may ramp up to substantially Vcm if Vcm is used as a supply voltage of the reference voltage generator 110. A separate comparator to compare the ramp voltage Vramp to Vcm may not be required because the ramp voltage Vramp may ramp up to substantially Vcm without exceeding Vcm. Intricate timing circuitry may not be required for the device 100 because the ramp voltage Vramp may ramp up to substantially Vcm and remain there. A low tolerance capacitor may be used for the capacitor C1; even with such a capacitor, the ramp voltage Vramp may ramp up to substantially Vcm.

The amplifier 120 may be any amplifier that may receive a voltage from a reference voltage generator including, but not limited to, a differential amplifier, a comparator, a sense amplifier and an operational amplifier. The amplifier 120 may be coupled to supply voltages Vcca and Vssa. The supply voltage Vcca may be any supply voltage including, but not limited to, about 2.7 to 3.3 volts. The supply voltage Vssa may be any supply voltage including, but not limited to, ground, for example. The switches 125 may close or open in response to an Activate signal and couple or decouple the amplifier 120 from the supply voltages Vcca and Vssa.

The amplifier 120 may have a positive input node 122 ("Input_pos") and a negative input node 124. The Input_pos node may be coupled to a selected one of Vcm, Vramp and ground via switches 150, 160, and 170, respectively. The switch 170 may be coupled to the same supply voltage to which the reference voltage generator 110 may be coupled, including, but not limited to, ground, for example. The negative input node 124 may receive an input signal Vin from an input signal source 140 via a resistor R1 and a switch S1. The input signal Vin may be a differential signal measured in relation to the common mode reference voltage Vcm. The input signal source 140 may generate the input signal Vin by any method of generating an input signal to an amplifier including, but not limited to, superposing Vcm and the differential signal and directly forming Vin without superposing stages.

The amplifier 120 may receive the input signal Vin and a selected voltage from a voltage selector (e.g., switches 150, 160, and 170 and the reference voltage generator 110) at the negative and positive input nodes of the amplifier 120, respectively. Alternatively, the amplifier 120 may receive the input signal Vin and a selected voltage from the voltage selector at the positive and negative input nodes of the amplifier 120, respectively. The input signal Vin may be an audio signal. When the input signal Vin is an audio signal, the switch S1 may operate as a mute switch and may pass little or no audio signal to the amplifier 120 and thus to the output device 130. The switch S1 may be closed after the ramp voltage Vramp ramps up to substantially Vcm. With the above described arrangement, the amplifier output of the amplifier 120 may ramp up or down at a controlled rate. This may enable a soft mute function, where abrupt transient components and pop noise may be reduced or eliminated during power-up or power-down of the device.

A resistor R2 may be coupled between an output node 126 and the negative input node 124. With this arrangement of the amplifier 120, for example, an amplifier output "Out" at the output node 126 of the amplifier 120 may have a value according to the following equation: Out=Vin×(−R2/R1)+Vcm. However, the depicted arrangement of the amplifier 120 having the described gain is exemplary only, and other known and/or yet to be discovered ways of amplifying an input signal with the same or different gain may also be used.

The output device 130 may produce an output of the device 100 in response to the amplifier output of the amplifier 120. The output device 130 may be any output device adapted to receive an output of an amplifier including, but not limited to, a speaker arrangement. For example, the output device 130 may include an output capacitance Co coupled to an output inductance Lo, an output resistance Ro and a speaker may be coupled to the inductor Lo. The output capacitance Co may operate as a direct current (DC) blocking capacitor.

One or more control units may be used to generate the signals used in the device 100 including, but not limited to, Power_up, Charge_b, Discharge, Vcm_en, Vramp_en, Vssa_en, and Activate signals.

In FIGS. 2A–I, a timing diagram illustrating operation of the device 100 is shown. During a period corresponding to an on-mode of abrupt transient reduction, the Vssa_en signal to the switch 170 may switch from a low state to a high state and then back to the low state to briefly couple the Input_pos node of the amplifier 120 to ground. When the Input_pos node of the amplifier 120 is coupled to ground, the Vcm_en signal may be low to open the switch 150. Subsequently, a Power_up signal may switch to a high state to turn on the current source 112. The Charge_b signal and Discharge signal may switch to a low state so that the current source switch 116 may close and the current sink switch 118 may open. The ramp voltage Vramp may be a rising ramp voltage and may ramp up to substantially Vcm. The switch 160 may close in response to a high state of the Vramp_en signal. The period in which the Vramp_en signal is in the high state to close the switch 160 may be a minimum period of time ("Tmin") required for a ramp voltage Vramp to traverse from one of Vcm and ground to the other one or a longer period including, but not limited to, about 1.5 times the minimum period.

After the voltage at the Nramp node reaches Vcm, the Vramp_en signal and Vcm_en signal may be switched to a low state and a high state, respectively, and the Input_pos node 122 may receive Vcm through the switch 150. By coupling Vcm to the Input_pos node of the amplifier 120 via the switch 150 after gradually ramping up the ramp voltage Vramp applied at the Input_pos node of the amplifier 120, the amplifier output of the amplifier 120 may be ramped up gradually. Thus, the amplifier output may have little or no abrupt transient component, which may cause an audible pop noise in the output of the output device 130 if, for example, a speaker is used for the output device. After Vcm is coupled to the Input_pos node of the amplifier 120, the Charge_b and the Discharge signals may switch to the high state, the current source switch 116 may open and the current sink switch 118 may close. The ramp voltage Vramp may be a falling ramp voltage and ramp down to substantially ground. The ramp voltage Vramp may remain at ground. Alternatively, the ramp voltage Vramp may not be ramped down and may remain at Vcm after a power-up operation of the device 100.

For a power-down operation of the device 100, the ramp voltage Vramp may be ramped up to Vcm by having the Charge_b signal and the Discharge signal in the low state. After the ramp voltage Vramp ramps up to substantially Vcm, the Charge_b signal and the Discharge signal may switch to the high state, and the ramp voltage Vramp may ramp down to substantially ground. The switch 160 may close in response to the high state of the Vramp_en signal, and may allow a voltage at the Input_pos node of the amplifier 120 to ramp down to substantially ground. After the ramp voltage Vramp ramps down to substantially ground, the Vssa_en signal may be switched to the high state to close the switch 170 after a period equal to the minimum period of time (Tmin) required for a ramp voltage Vramp at the Nramp node to traverse from one of Vcm and ground to the other one or a longer period including, but not limited to, 1.5 times the minimum period. By coupling ground to the Input_pos node of the amplifier 120 via the switch 170 after gradually ramping down a voltage at the Input_pos node, the amplifier output of the amplifier 120 may be ramped down gradually. Thus, the amplifier output may have little or no abrupt transient component.

During the power-up or power-down operation of the amplifier 120, the switch S1 may be open, and the input signal Vin may not be amplified. Alternatively, the switch S1 may be closed during the power-up or power-down operation, and the input signal Vin may be applied to the amplifier 120. When the switch S1 is closed during the power-up operation, the gain of the amplifier 120 in response to the ramp voltage Vramp applied at the Input_pos node may equal 1+R2/R1. Alternatively, when the switch S1 is open during the power-up operation, the gain of the amplifier 120 in response to the ramp voltage Vramp applied at the Input_pos node may equal 1. However, the depicted arrangement of the amplifier 120 and the described gain is exemplary only, and other known and/or yet to be discovered ways of amplifying a signal at the Input_pos node with the same or different gain may also be used.

The low state of any of the signals in FIGS. 2A–I may have any voltage including, but not limited to, ground and Vssa, for example. Each of the ramp voltage Vramp in FIG. 2D and the amplifier output Out in FIG. 2I (when the switch S1 is open) may have a high state of any voltage including, but not limited to, Vcm, for example. The high state of any of the signals in FIGS. 2B, 2C and 2E–H may have any voltage including, but not limited to, Vcca and Vcm, for example.

In FIGS. 3A–H, a smooth transient operation of a device according to an exemplary embodiment of the invention is shown. The amplifier output of the amplifier 120 may ramp up during a power-up operation and ramp down during a power-down operation. A voltage at the Input_pos node of the amplifier 120 may ramp up during the power-up operation and ramps down during the power-down operation. As an example, the input signal Vin may be any signal that does not saturate the amplifier. The input signal Vin may be an analog current (AC) signal with a constant amplitude. The Vssa_en signal may have a high state after a voltage at the Input_pos node of the amplifier 120 ramps down to substantially ground. The Vcm_en signal may have a high state after the voltage at the Input_pos node of the amplifier 120 ramps up to substantially Vcm during the power-up operation. The Vramp_en signal may be in a high state during the power-up and the power-down operations. A voltage at the Nramp node may ramp up and down during the power-up and the power-down operations, respectively. The Charge_b and Discharge signals may be in a high state during the power-down operation to ramp down the ramp voltage Vramp.

Figure 4:
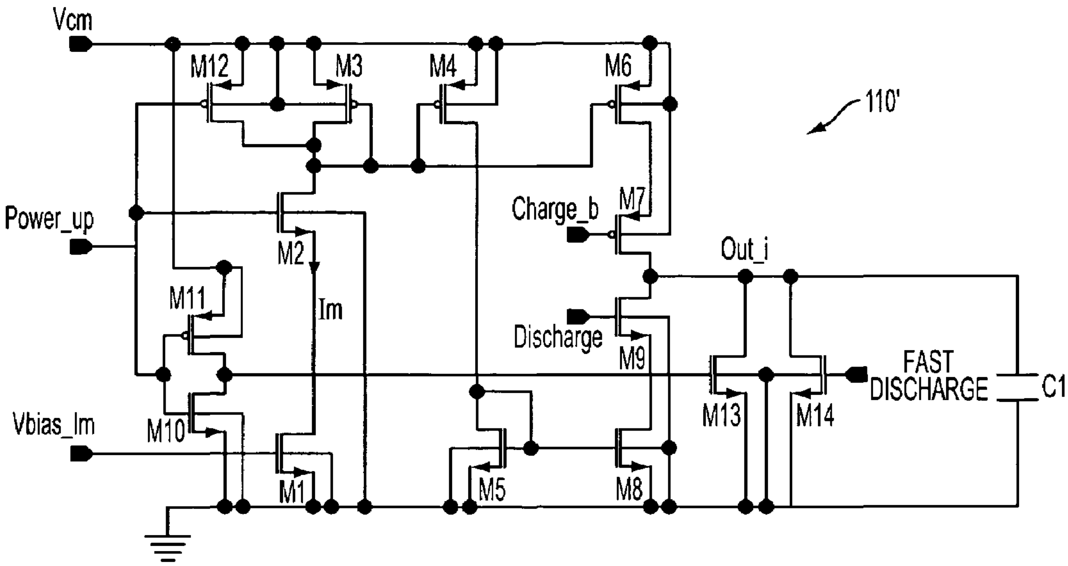
FIG. 4 shows a device component according to an exemplary embodiment of the invention.

In FIG. 4, a reference voltage generator 110' having a constant current source and a constant current sink according to an exemplary embodiment is shown. The reference voltage generator 110' may have a first supply input node coupled to Vcm. The reference voltage generator 110' may have a Power_up signal applied to transistors M10–M12 and M2. Transistor M1 may receive a bias voltage Vbias_Im to generate a current Im through the transistor M2. The bias voltage Vbias_Im may be developed in a device disposed on an integrated circuit (IC), wherein the reference voltage generator 110' may also be disposed on the same IC. Transistors M3–M6 and M8 may be coupled as a current mirror and mirror the current Im through the transistors M2 and M3 to a source current through the transistor M6 and a sink current through the transistor M8. The transistors M3, M4 and M6 may be matched transistors, and the source current through the transistor M6 may have the same magnitude as the current Im through the transistor M3. Similarly, the transistors M1, M5 and M8 may be matched transistors, and the sink current through the transistor M8 may have the same magnitude as the current Im through the transistor M3. The current Im may have any current magnitude including, but not limited to, about 1 $\mu$A+/−3%, for example.

Initially, the Power_up signal may be in a low state, and the transistor M2 may be turned off to disable the current Im through the transistor M3. The low state of the Power_up signal may turn on the transistors M11 and M13 and may couple the output node Out_i to ground. Thus, the voltage reference generator 110' may be deactivated. When the Power_up signal is in a high state, the voltage reference generator 110' may be activated. The transistors M2–M6 and M8 may be turned on to generate the source current through the transistor M6 and the sink current through the transistor M8. The Charge_b signal may be applied to close or open the current source switch M7, and the Discharge signal may be applied to close or open the current sink switch M9. The Charge_b signal and the Discharge signal may be a common signal or different signals. The transistor M14 may be coupled to a Fast Discharge signal and quickly discharge the Out_i node when the transistor M14 is closed. Alternatively, the transistor M14 may be permanently grounded.

Figure 5A:
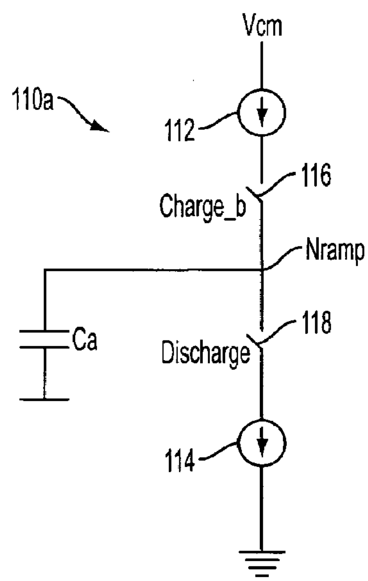
FIGS. 5A–C show device components according to exemplary embodiments of the invention.

In FIG. 5A, a reference voltage generator 110*a* having an off-chip capacitor Ca according to an exemplary embodiment of the invention is shown. The off-chip capacitor Ca may have a selected capacitance value by choosing an off-chip capacitor with an appropriate capacitance value, or when the capacitor Ca is formed of plural capacitors coupled via switches, by varying the capacitance of the capacitor C1 by opening and/or closing switches between the capacitors to achieve a desired combinative capacitance value. By varying the capacitance of the off-chip capacitor Ca, a voltage change rate at the Nramp node may vary.

Figure 5B:
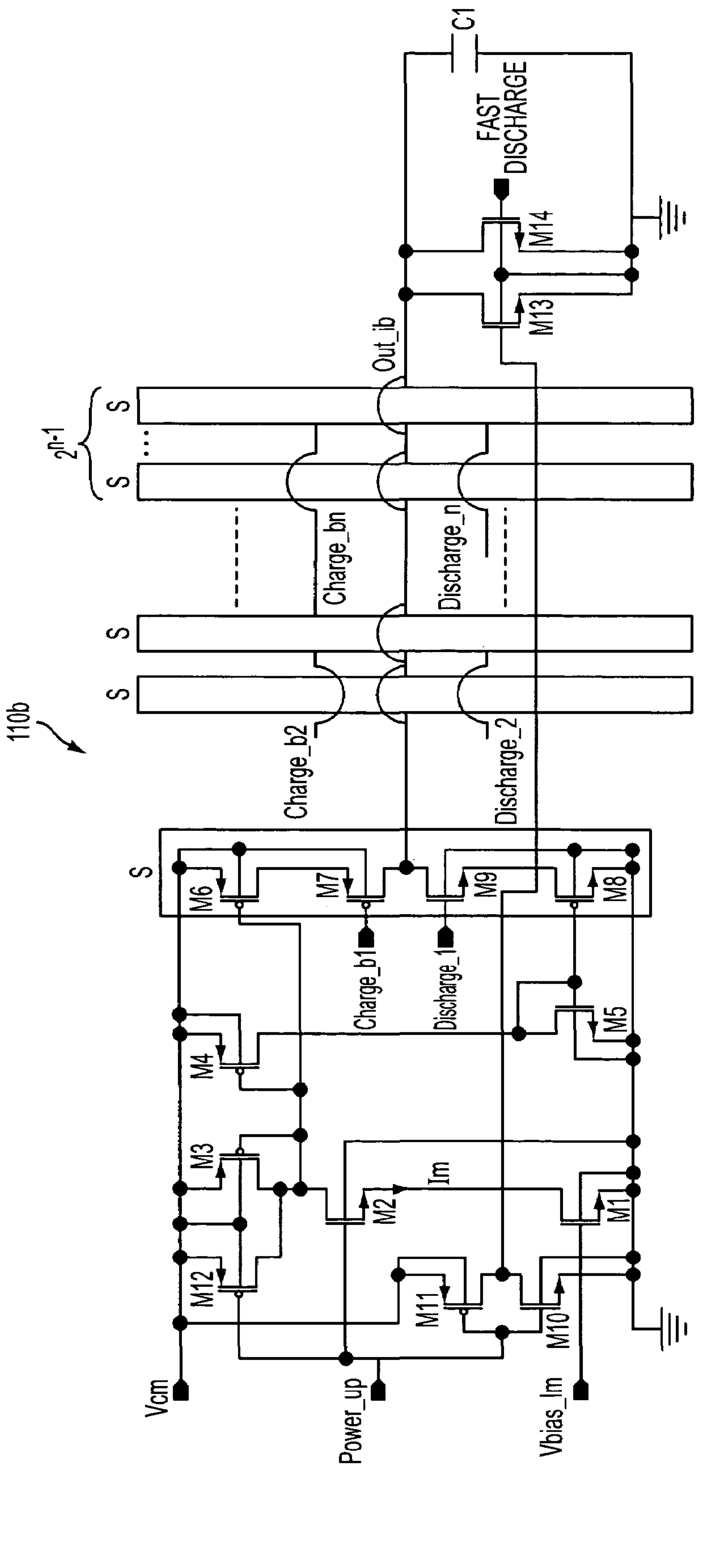

In FIG. 5B, a reference voltage generator 110*b* having a digital to analog converter (DAC) according to an exemplary embodiment of the invention is shown. The reference voltage generator 110*b* may be physically analogous to and may operate in a similar way to the reference voltage generator 110' in FIG. 4 except that there may be additional current sources and current sinks. The additional current sources and current sinks may form a DAC, where there may be a multiple number of S stages of transistors M6–M9.

The DAC may receive a Charge_b digital signal having a first bit signal Charge_b1, a second bit signal Charge_b2, a third bit signal Charge_b3, and bit signals Charge_b4 through Charge_bn for a total of n bit signals. Each bit signal may be applied to a respective group of S stages; for example, Charge_b1 to the first group, Charge_b2 to the second group, Charge_b3 to the third group, and Charge_b4 through Charge_bn to the fourth through the n-th groups of S stages, respectively. The first group, second group, third group, and fourth through n-th groups of S stages have one, two, four and $2^3 \ldots 2^{n-1}$ number of S stages, respectively.

Similarly, the DAC may receive a Discharge digital signal having a first bit signal Discharge_1, a second bit signal Discharge_2, a third bit signal Discharge_3, and bit signals Discharge_4 through Discharge_n for a total of n bit signals. Each bit signal may be applied to a respective group of S stages; for example, Discharge_1 to the first group, Discharge_2 to the second group, Discharge_3 to the third group, and Discharge_4 through Discharge_n to the fourth through the n-th groups of S stages, respectively. The Charge_b digital signal and the Discharge digital signal may be a common signal or different signals.

Each S stage may be identical except that each stage belongs to a particular group of S stages that receive the same Charge_b and Discharge bit signals. The transistors M6 and M8 of all S stages may be coupled as current mirrors to the transistors M3–M5 and may receive the same bias voltages as the transistors M6 and M8 of the S stage of the first group.

The n groups of S stages may all have the output nodes of the stages coupled in common, and, thus, a resulting current at the Out_ib may have a magnitude equal to a summation of all current outputs of the S stages. With such arrangement, the first group may output a current with a magnitude equal to Im, the second group may output a current with a magnitude equal to 2 Im, the third group may output a current with a magnitude equal to 4 Im and so on. Thus, by appropriately controlling the digital signals applied to groups of S stages, the DAC may output a desirable source or sink current at the Out_ib node by converting the digital signals to an analog current. The analog current generated at the Out_ib node may be applied to a capacitor C1, and the voltage at the output_ib node may ramp up or down at a desirable rate by appropriately controlling the digital signals applied to the DAC and, thus, the analog current applied to the capacitor C1. However, the arrangement of the DAC in FIG. 5B is exemplary only, and other known and/or yet to be discovered ways of generating a ramp voltage with a DAC may also be used.

Figure 5C:
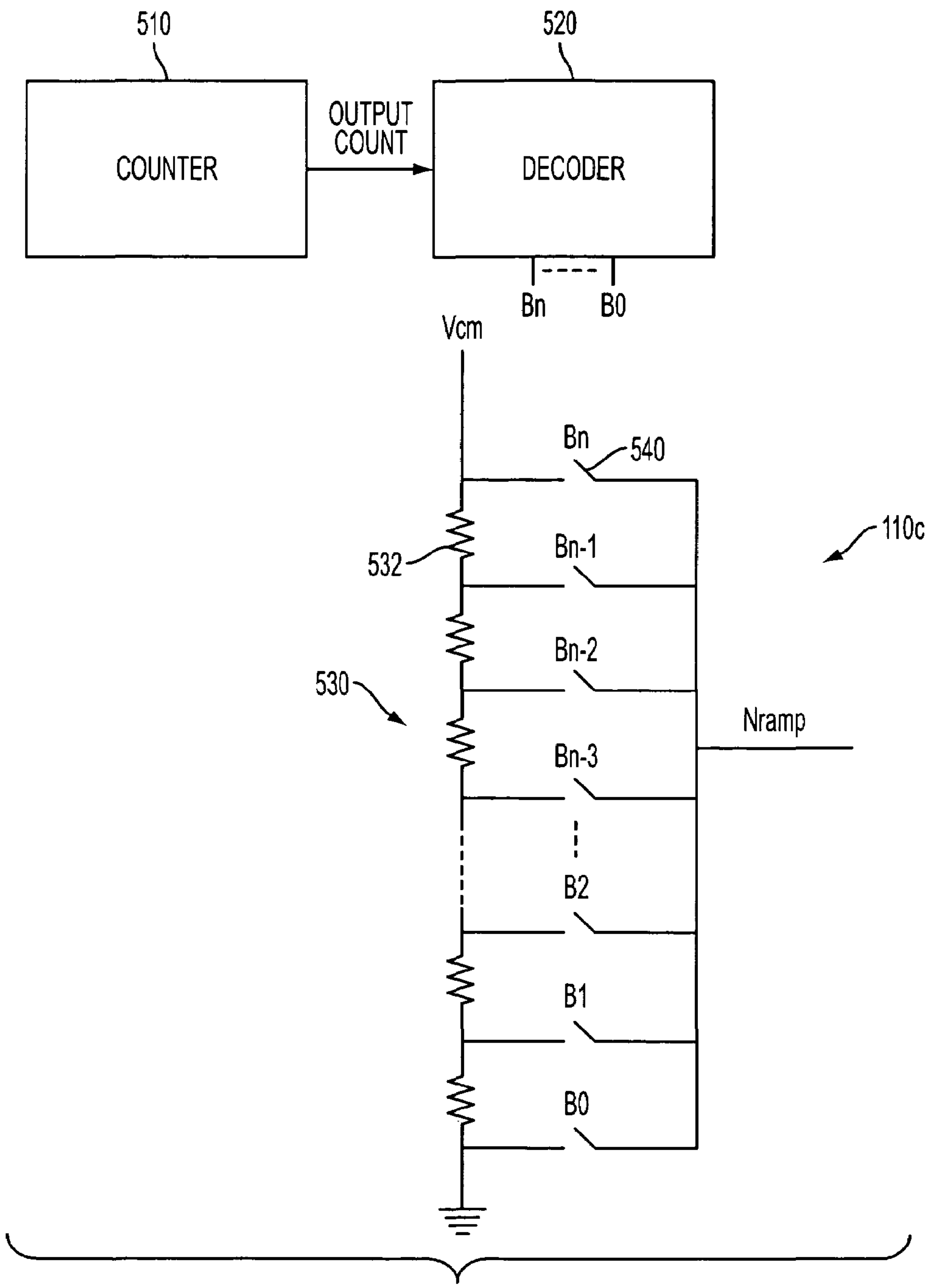

In FIG. 5C, a reference voltage generator 110*c* having a potentiometer 530 according to an exemplary embodiment of the invention is shown. The potentiometer 530 may include a number of series coupled resistors 532 and a number of switches 540 coupled to the intervening nodes between the series coupled resistors 532. The switches 540 may be progressively activated to selectively output a progressively higher or lower voltage as the ramp voltage Vramp. During an operation of the reference voltage generator 110*c*, a counter 510 may count up or down depending on whether a voltage at the Nramp node is to be a rising ramp voltage or a falling ramp voltage, respectively. The counter 510 may be any counter including, but not limited to, an up-down counter. A decoder 520 may receive the output count of the counter 510 and may generate bit signals B0–Bn. Only one of the bit signals may be activated, and a switch 540 corresponding to the activated signal Bm, where $0<m<n$, may close. For example, during the count up mode of the counter 510, the counter 510 may increase an output count from 0 to n at a periodic cycle. In response to the output count, the decoder 520 may generate signals B0–Bn, where a signal Bm with m increasing progressively from 0 to n may be active during a counter period. Thus, a progressively higher intervening node of the potentiometer 530 may be coupled to the Nramp node by the progressively activated signal Bm during the count up mode of the counter 510.

Similarly, during a count down mode, the counter 510 may decrease an output count from n to 0 at a periodic cycle for example. In response to the output count, the decoder 520 may generate signals B0–Bn, where a signal Bm with m decreasing progressively from n to 0 may be active during a counter period. Thus, a progressively lower intervening node of the potentiometer 530 may be coupled to the Nramp node by the progressively activated signal Bm during the count down mode of the counter 510.

Figure 6:
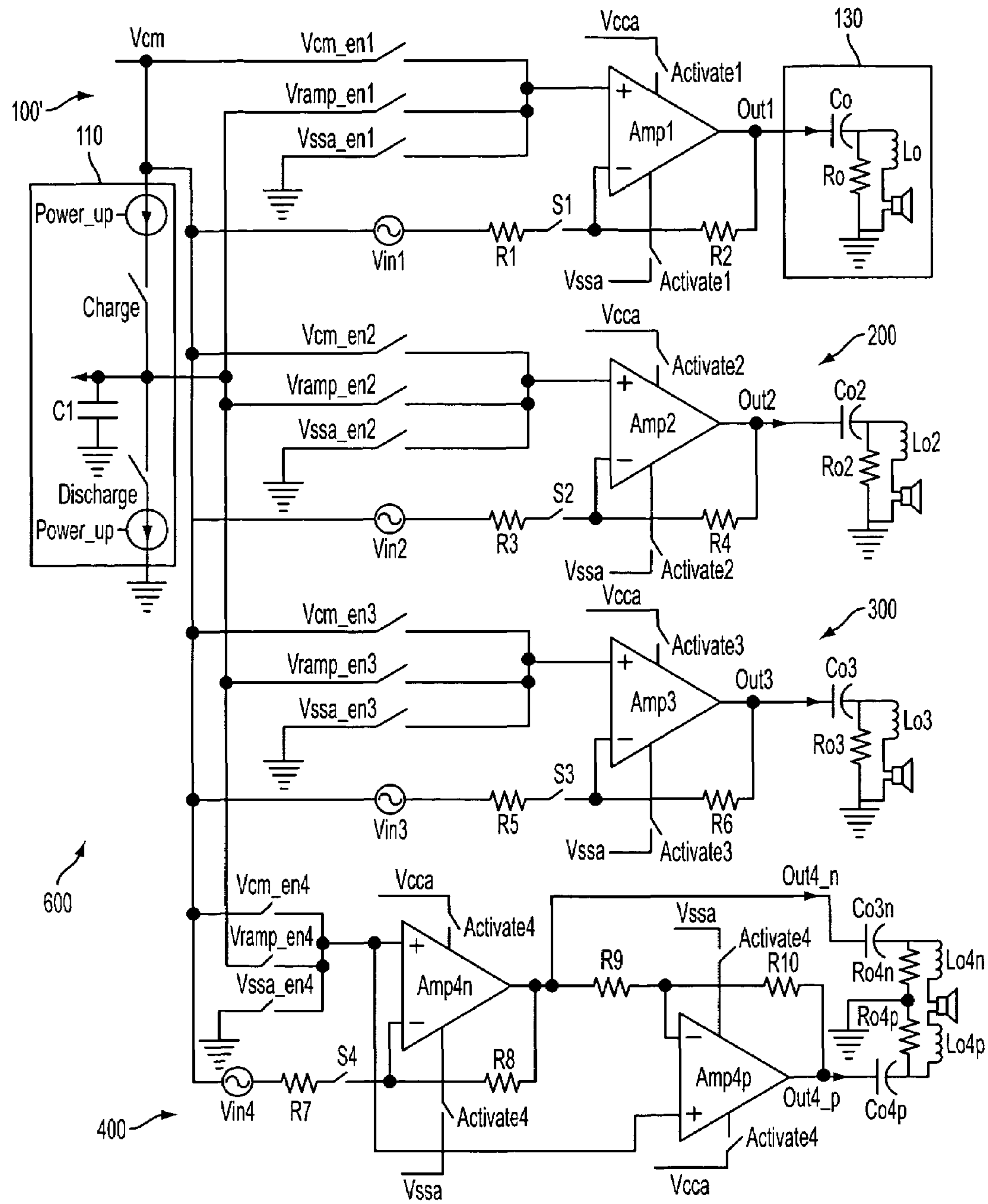
FIG. 6 shows a device according to another exemplary embodiment of the invention.

In FIG. 6, a device 600 having plural amplifier stages 100'–400 sharing a reference voltage generator 110 according to an exemplary embodiment of the invention is shown. Each stage 100'–400 may be physically analogous to and may operate in a similar way to the embodiment of the device 100 in FIG. 1. The device 600 may differ from the device 100 in FIG. 1 in that the reference voltage generator 110 may be shared by the amplifier stages 100'–400. In sharing the reference voltage generator 110, each amplifier stage 100'–400 may be powered up or powered down one after another by following the power-up and power-down operations of the device 100 in FIG. 1. Alternatively, two or more amplifier stages may be powered up or powered down simultaneously by applying common control signals to the corresponding amplifier stages during the power-up and power-down operations. By having the simultaneous power-up and power-down operations, the same ramp voltages of the reference voltage generator 110 may be commonly used for the two or more amplifier stages and may cause little or no abrupt transient component in the amplifier outputs. The above described sharing of the reference voltage generator 110 by plural amplifier stages is exemplary only, and other known and/or yet to be discovered ways of sharing a reference voltage generator by plural amplifier stages may also be used.

Figure 7:
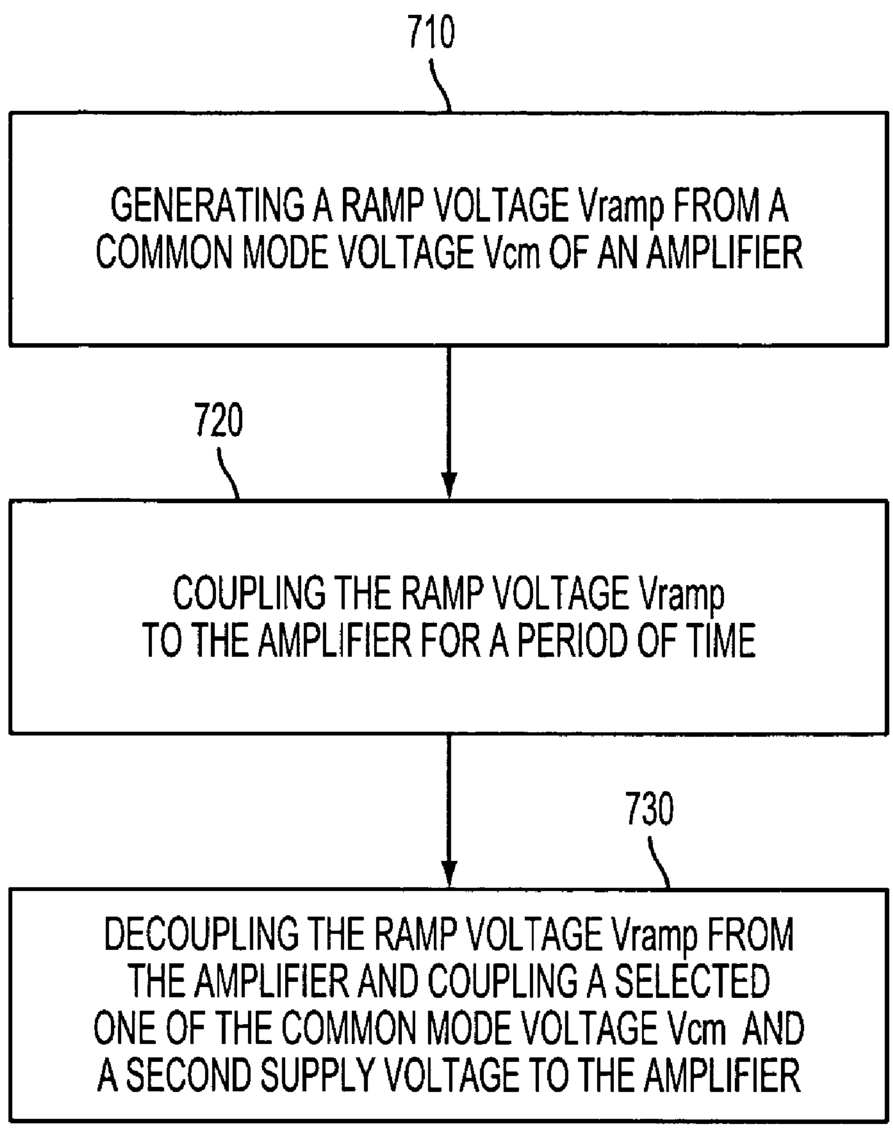
FIG. 7 shows a method according to an exemplary embodiment of the invention.

In FIG. 7, a method of applying selected voltages to an amplifier according to an exemplary embodiment of the invention is disclosed. In block 710, a ramp voltage Vramp may be generated by applying a common mode voltage Vcm of an amplifier and a second supply voltage to a reference voltage generator. In block 720, the ramp voltage Vramp may be coupled to the amplifier for a period of time (e.g., during a power-up operation). In block 730, the ramp voltage Vramp may be decoupled from the amplifier, and a selected one of the common mode voltage Vcm and the second supply voltage may be coupled to the amplifier. The ramp voltage Vramp may be at least one of a rising ramp voltage that ramps up to substantially the common mode voltage Vcm (e.g., during a power-up operation) and a falling ramp voltage that ramps down to substantially the second supply voltage (e.g., during a power-down operation). An input signal Vin may be selectively coupled to the amplifier during a power-up or power-down operation.

The exemplary embodiments shown in FIGS. 1 through 7 may be used in any system or device including, but not limited to, audio amplifiers that are used as speaker drivers in cell phones, handheld PDAs, earphone headsets, telephone headsets, home theater systems, audiocodecs for cell phone handsets, and any other audio amplifier products.

The foregoing description is intended to be illustrative and not limiting. Variations will occur to those of skill in the art. Those variations are intended to be included in the various embodiments of the invention, which are limited only by the spirit and the scope of the appended claims.

What is claimed is:

1. A device, comprising:

a reference voltage generator having a first supply input node adapted to be coupled to a common mode voltage of an amplifier and a second supply input node adapted to be coupled to a second supply voltage, the reference voltage generator being adapted to generate a ramp voltage; and a voltage selector coupled to the reference voltage generator, the voltage selector being adapted to receive as inputs the ramp voltage and at least one of the common mode voltage and the second supply voltage and being adapted to select one of the inputs of the voltage selector to couple to a first input node of the amplifier.

2. The device of claim 1, further comprising an input signal coupling switch adapted to selectively couple an input signal to a second input node of the amplifier.

3. The device of claim 2, wherein the first and second input nodes of the amplifier are positive and negative input nodes of the amplifier.

4. The device of claim 1, wherein the voltage selector comprises:

a reference voltage coupling switch adapted to selectively couple the ramp voltage to the first input node of the amplifier;

a common mode voltage coupling switch adapted to selectively couple the common mode voltage to the first input node of the amplifier; and a second supply voltage coupling switch adapted to selectively couple the second supply voltage to the first input node of the amplifier.

5. The device of claim 4, wherein the reference voltage generator comprises a capacitor adapted to be selectively coupled to the first input node of the amplifier through the reference voltage coupling switch.

6. The device of claim 1, wherein the reference voltage generator is adapted to generate at least one of a rising ramp voltage that ramps up to substantially the common mode voltage and a falling ramp voltage that ramps down to substantially the second supply voltage.

7. The device of claim 4, further comprising at least one control unit adapted to control the reference voltage generator to generate a rising ramp voltage and adapted to close the reference voltage coupling switch during a power-up of the device.

8. The device of claim 7, wherein the at least one control unit is adapted to open the reference voltage coupling switch and adapted to close the common mode voltage coupling switch after a period of time during the power-up.

9. The device of claim 1, further comprising at least one control unit adapted to control the reference voltage generator to produce a falling ramp voltage during a power-down of the device.

10. A system, comprising:

an amplifier having a first input node, a second input node adapted to receive an input signal and an output node;

an output device coupled to the output node of the amplifier; and a voltage selector having a first supply input node adapted to be coupled to a common mode voltage of the amplifier and a second supply input node adapted to be coupled to a second supply voltage, the voltage selector being adapted to select among a ramp voltage and at least one of the common mode voltage and the second supply voltage to couple to the first input node of the amplifier.

11. The system of claim 10, further comprising a switch having a first end adapted to be coupled to the input signal and a second end adapted to be coupled to the second input node of the amplifier.

12. The system of claim 10, further comprising a second amplifier adapted to be coupled to the voltage selector and a second output device adapted to be coupled to an output node of the second amplifier.

13. The system of claim 10, wherein the input signal is an audio signal and the voltage selector is adapted to provide the ramp voltage to the amplifier to reduce pop noise during at least one of a power-up and a power-down of the system.

14. The system of claim 10, wherein the voltage selector is adapted to provide at least one of a rising ramp voltage that ramps up to substantially the common mode voltage and a falling ramp voltage that ramps down to substantially the second supply voltage.

15. The system of claim 14, further comprising at least one control unit adapted to control the voltage selector to produce the rising ramp voltage during a power-up of the system.

16. The system of claim 14, further comprising at least one control unit adapted to control the voltage selector to generate the falling ramp voltage during a power-down of the system.

17. A method, comprising:

generating a ramp voltage by applying a common mode voltage of an amplifier and a second supply voltage to a reference voltage generator;

coupling the ramp voltage to the amplifier for a period of time;

decoupling the ramp voltage from the amplifier; and coupling a selected one of the common mode voltage and the second supply voltage to the amplifier after the period of time.

18. The method of claim 17, further comprising generating an output signal at an output node of the amplifier in response to the coupling of the ramp voltage to the amplifier.

19. The method of claim 17, wherein the generating the ramp voltage comprises generating at least one of a rising ramp voltage that ramps up to substantially the common mode voltage and a falling ramp voltage that ramps down to substantially the second supply voltage.

20. The method of claim 19, wherein the generating the ramp voltage further comprises generating the rising ramp voltage during a power-up operation.

21. The method of claim 19, wherein the generating the ramp voltage further comprises generating the falling ramp voltage during a power-down operation.

22. The method of claim 17, wherein the coupling of the selected one of the common mode voltage and the second supply voltage to the amplifier further comprises coupling the common mode voltage to the amplifier; and wherein the method further comprises generating a falling ramp voltage after coupling the common mode voltage to the amplifier.

23. The method of claim 17, further comprising selectively coupling an input signal to the amplifier.

* * * * *